(12) United States Patent
Kiefer

(10) Patent No.: US 6,590,150 B1
(45) Date of Patent: Jul. 8, 2003

(54) COMBINATION PHOTOVOLTAIC CELL AND RF ANTENNA AND METHOD

(76) Inventor: Karl F. Kiefer, 19221 IH-45 S., Suite 530, Conroe, TX (US) 77385

( * ) Notice: Subject to any disclaimer, the term of this patent is extended or adjusted under 35 U.S.C. 154(b) by 0 days.

(21) Appl. No.: 09/853,793

(22) Filed: May 11, 2001

(51) Int. Cl.[7] .............................. H01L 31/04; H01Q 1/00
(52) U.S. Cl. ..................... 136/291; 136/24; 136/258; 136/261; 136/262; 438/64; 438/96; 438/97; 438/57; 343/721; 343/906
(58) Field of Search ............................ 136/291, 244, 136/258, 261, 262; 438/64, 96, 97, 57; 343/721, 906

(56) References Cited

U.S. PATENT DOCUMENTS

| | | | |
|---|---|---|---|
| 4,490,668 A | 12/1984 | Sterzer | |
| 4,751,513 A | 6/1988 | Daryoush et al. | |
| 6,087,991 A | 7/2000 | Kustas | |
| 6,395,971 B1 * | 5/2002 | Bendel et al. | 136/244 |

FOREIGN PATENT DOCUMENTS

DE      19938199 C1 *    1/2001

OTHER PUBLICATIONS

Tanaka et al, Electronics Letters, vol. 31, No. 1, pp. 5–6, Jan. 5, 1995.*
Vaccaro et al, Electronics Letters, vol. 36, No. 5, pp. 390–391, Mar. 2, 2000.*
Vaccaro et al, Electronics Letters, vol. 36, No. 25, pp. 2059–2060, Dec. 7, 2000.*

* cited by examiner

Primary Examiner—Alan Diamond
(74) Attorney, Agent, or Firm—Kenneth A. Roddy

(57) ABSTRACT

A combination photovoltaic cell and RF antenna in a single unit performs the dual functions of transmitting and receiving RF signals to and from a transceiver and converting light waves to electric power to operate the transceiver. The photovaltaic cell is formed of semiconductor material laminated to a thin dielectric backing and electrically connected with the power circuit of the transceiver to supply electrical power thereto. The dielectric backing is bonded to a metallic substrate to provide a ground plane. A tuned shielded cable having a signal conductor is interconnected between the photovoltaic cell and the RF output stage of the transceiver, and the conductive shield of the cable is interconnected between the metallic substrate ground plane and the ground stage of the transceiver such that the photovoltaic cell transmits and receives RF signals to and from the transceiver and also converts light waves to electric power to operate the transceiver.

10 Claims, 1 Drawing Sheet

COMBINATION PHOTOVOLTAIC CELL AND RF ANTENNA AND METHOD

BACKGROUND OF THE INVENTION

1. Field of the Invention

This invention relates generally to photovoltaic cells and RF antenna devices, and more particularly to a combination photovoltaic cell and RF antenna that performs the dual function of transmitting and receiving RF signals to and from a transceiver and converts light waves to electric power to operate the transceiver, and to a method of interconnecting and using the same.

2. Brief Description of the Prior Art

Photovoltaic cells, also commonly referred to as solar cells, convert light or solar energy into electrical energy and are used to generate electrical power in both terrestrial and space applications. Solar cells offer a clean, but relatively expansive, method for generating electricity and are commonly used as a primary or secondary power source for small electronic devices that have low electrical power requirements, such as hand-held calculators. More complex systems provide electricity for pumping water, powering communications equipment, lighting, and various appliances. The solar panels or arrays are located in close proximity to, but separate from the communications equipment and they function only to supply power to the device.

Solar cells are also used for generating electricity in locations that may prohibit the use of conventional power sources and where size, area and weight constraints are a premium, such as in outer space applications.

The International Space Station (ISS) and earth orbiting satellites include solar arrays for generating power and separate antenna assemblies for communicating with ground stations and/or other spacecraft. The solar arrays require a vast area and large structure that is dedicated to solar energy collection and a separate assembly is required for the several high gain (directional) antennas that provide air to ground and air to TDRAS communications for data and voice. The International Space Station's electrical power system (EPS) will utilize eight photovoltaic solar arrays to convert sunlight to electricity. Each of the eight solar arrays will be 112 ft. long by 39 ft. wide. With all eight arrays installed, the complete Space Station is large enough to cover a football field.

Typically the solar panels of power generating subsystems and the antenna arrays of communication subsystems are separately constructed, supported and operated. The communications antenna array sub-system that transmits and receives electromagnetic signals, such as radio frequency (RF) signals is connected by electromagnetic signal feed lines to a signal processor unit that utilizes power from the power generating sub-system to processes the signals received by the antenna array and generate electromagnetic signals that are fed back to the antenna array for transmission.

In outer space applications, as discussed above, the RF communication antenna and the solar panel arrays cover a very large area when the spacecraft is in orbit. These large structures must be properly and carefully positioned so as to avoid shadowing one another. Otherwise the RF antenna could block some of the sunlight from reaching the photovoltaic cells within the array, reducing electrical performance. Conversely, the structure of the solar array would interfere with passage of RF radiation from and to the reflector, reducing the antenna's performance.

In many terrestrial and outer space applications small electronic wireless transceiver devices and instruments powered by the solar cell array are employed to monitor temperature, pressure, and vibration, and transmit and receive electromagnetic (RF) data and voice signals via a separate antenna. These devices are often disposed where there is little room for antenna or solar collector.

Thus, in most prior art systems that employ photovoltaic cells as a power source and antennas that transmit and receive electromagnetic (RF) signals, the power generating system and the communication antenna system are separately constructed, supported and operated. Therefore, it would be desirable to provide a combination photovoltaic cell and RF antenna in a single unit that performs the dual function of transmitting and receiving RF signals to and from a transceiver and converts light waves to electric power to operate the transceiver.

Sterzer U.S. Pat. No. 4,490,668 discloses a space-oriented microwave radiator apparatus for converting solar energy to microwave energy. The microwave energy is used to generate an RF beam for propagation to the earth. The apparatus is formed into an extended planar sandwich-like structure carrying solar cells on one surface facing the sun and microwave devices on the other face for generating the RF beam. The microwave devices are energized by the solar cells, and function to generate the RF energy. The apparatus is useful for converting solar energy to microwave power, and to operate communication satellites and satellites having radar functions.

Daryoush et al, U.S. Pat. No. 4,751,513 discloses light controlled antennas having characteristics that are modified by photosensitive electrical elements connected to the radiating elements. The photosensitive elements are biased by light, by direct electrical bias, or both. The photosensitive element may be a PIN diode. The bias may be applied by general illumination or conducted by a fiber optic cable.

Kustas, U.S. Pat. No. 6,087,991 discloses a semiconductor antenna array and solar energy collection array assembly for spacecraft The assembly comprises an antenna array portion including a plurality of photonically-activatable semiconductor elements. The array assembly may also include a solar energy collection array portion having a plurality of photovoltaic cells. The two arrays may be supportably positioned on opposing sides of a common support structure (e.g. a dielectric substrate). An activation arrangement is provided to transmit photonic energy from an external source, such as solar radiation from the sun, received on a back side of the assembly to photonically-activatable elements to increase their electrical conductivity and thereby activate them for transmission and/or reception of electromagnetic signals. The activation arrangement may also feed photonic energy from an internal photonic energy source, such as laser diodes, through optical fibers to activate the photonically-activatable elements. A method of operating a solar-activated, antenna assembly involves positioning an array of photonically-activatable elements to receive photonic solar energy. The photonic energy activates the antenna array elements for operation. As such, while photonic energy is being received, the array of photoconductive semiconductor elements may be operated for transmitting and/or receiving electromagnetic signals.

The present invention is distinguished over the prior art in general, and these patents in particular, by a combination photovoltaic cell and RF antenna in a single unit that performs the dual functions of transmitting and receiving RF signals to and from a transceiver and converting light waves to electric power to operate the transceiver. The photovaltaic cell is formed of semiconductor material laminated to a thin dielectric backing and electrically connected with the power circuit of the transceiver to supply electrical power thereto. The dielectric backing is bonded to a metallic substrate to provide a ground plane. A tuned shielded cable having a signal conductor is interconnected between the photovoltaic cell and the RF output stage of the transceiver, and the conductive shield of the cable is interconnected between the metallic substrate ground plane and the ground stage of the transceiver such that the photovoltaic cell transmits and receives RF signals to and from the transceiver and also converts light waves to electric power to operate the transceiver.

SUMMARY OF THE INVENTION

It is therefore an object of the present invention to provide a combination photovoltaic cell and RF antenna in a single unit that performs the dual function of transmitting and receiving RF signals to and from a transceiver and converts light waves to electric power to operate the transceiver.

It is another object of this invention to provide a combination photovoltaic cell and RF antenna in a single unit and method which reduces the weight, size and area of communications systems and power generating systems.

Another object of this invention is to provide a combination photovoltaic cell and RF antenna in a single unit and method that performs the dual function of providing a transceiver with electromagnetic (RF) signal transmission and reception capability and solar energy for its operation.

A further object of this invention is to provide a combination photovoltaic cell and RF antenna in a single unit which may be assembled in an array functioning as both power generating solar panels and communication antenna arrays and will reduce the structure and assembly required in outer space applications for separate antenna and solar panel arrays.

A still further object of this invention is to provide a combination photovoltaic cell and RF antenna in a single unit that may be easily applied to small wireless electronic transceiver devices that monitor temperature, pressure, and vibration, and transmit and receive electromagnetic (RF) data and voice signals whereby the solar cell that operates the device also serves as an RF antenna for command and control as well as data download.

Other objects of the invention will become apparent from time to time throughout the specification and claims as hereinafter related.

The above noted objects and other objects of the invention are accomplished by a combination photovoltaic cell and RF antenna in a single unit that performs the dual functions of transmitting and receiving RF signals to and from a transceiver and converting light waves to electric power to operate the transceiver. The pliotovaltaic cell is formed of semiconductor material laminated to a thin dielectric backing and electrically connected with the power circuit of the transceiver to supply electrical power thereto. The dielectric backing is bonded to a metallic substrate to provide a ground plane. A tuned shielded cable having a signal conductor is interconnected between the photovoltaic cell and the RF output stage of the transceiver, and the conductive shield of the cable is interconnected between the metallic substrate ground plane and the ground stage of the transceiver such that the photovoltaic cell transmits and receives RF signals to and from the transceiver and also converts light waves to electric power to operate the transceiver.

DESCRIPTION OF THE PREFERRED EMBODIMENT

Figure 1:
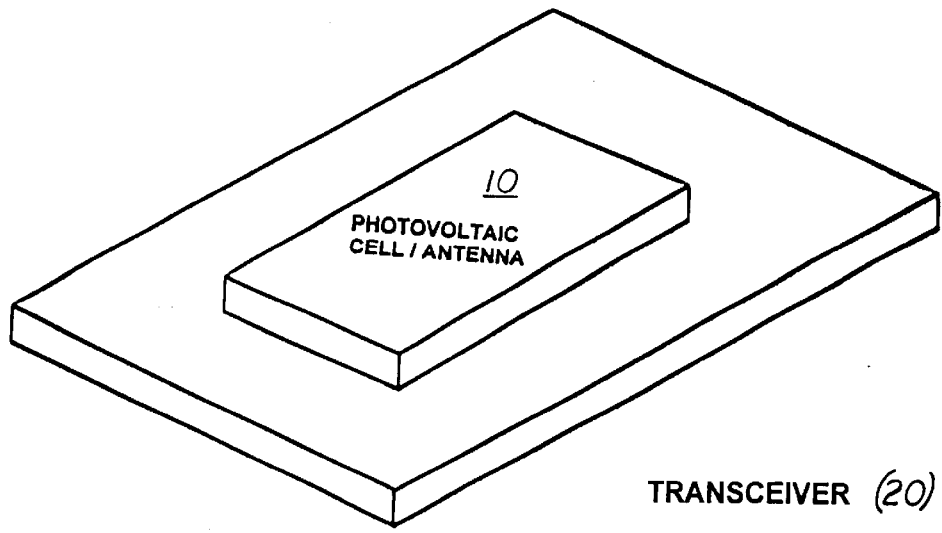
FIG. 1 is a perspective view of the combination photovoltaic cell and RF antenna installed on an electronic transceiver in accordance with the present invention.
Figure 2:
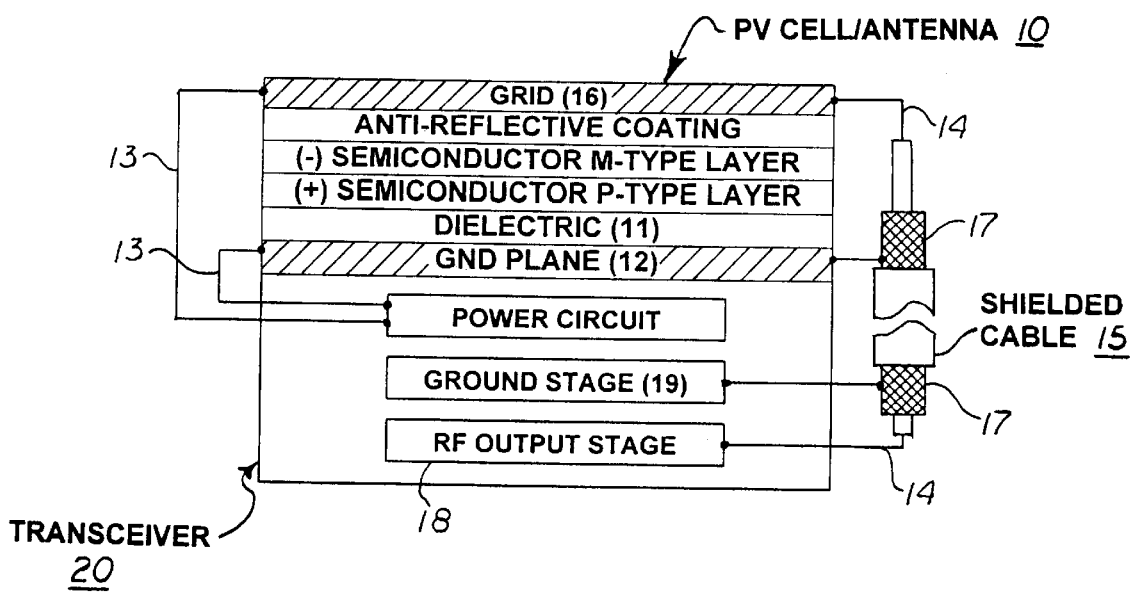
FIG. 2 is a cross sectional diagram showing schematically the electrical circuitry for interconnecting the combination photovoltaic cell and RF antenna with the power circuit and the RF output stage of the transceiver to transmit and receive RF signals to and from the transceiver and convert light waves to electric power to operate the transceiver.

Referring to the drawings by numerals of reference, there is shown in FIGS. 1 and 2, a preferred combination photovoltaic cell and RF antenna 10 installed on an electronic transceiver 20. The dual function photovoltaic cell and RF antenna is formed of semiconductor material laminated to a thin dielectric backing 11 and the dielectric backing is bonded to a metallic substrate 12 to provide a ground plane.

The photovoltaic cell is electrically connected by wire leads 13 with the power circuit of the transceiver (or load) to supply electrical power thereto in the manner of a conventional solar cell.

One end of the electrical conductor 14 of a tuned shielded cable 15 that transports electromagnetic signals is interconnected with the grid or front electrical contact 16 of the photovoltaic cell and one end of the conductive shield 17 of the cable is interconnected with the ground plane 12.

The other end of the electrical conductor 14 of the shielded cable 15 is interconnected with the RF output stage 18 of the transceiver 20 and the other end of the conductive shield 17 is interconnected with the ground stage 19 of the transceiver.

The shielded cable 15 is tuned to insure correct impedance for the optimum energy transfer between the transceiver 20 and photovoltaic cell antenna 10. This is accomplished by selecting an existing coax cable configuration that displays a particular AC impedance (measured in ohms) or by "tuning" the coax cable by adding or subtracting capacitive or inductive impedance using passive circuit components such as capacitors and inductors, a well known impedance matching technique used in the field of electronics.

The semiconductor material of the photovoltaic cell 10 serves as a "patch" antenna to transmit and receive electromagnetic (RF) signals to and from the transceiver 20 and converts light waves to electric power to operate the transceiver. The transmission and reception function does not, in any way, interfere with the primary function of the photovoltaic cell to convert light to the electric power required to operate the electronics of the transceiver. During "dual use", both functions operate without degradation.

The semiconductor material used may be gallium arsenide, indium gallium arsenide, amorphous silicon, or polycrystalline silicon. Gallium arsenide (GaAs) is a preferred semiconductor material for use for several reasons. It is highly efficient, it has a band gap which is suitable for single-junction solar cells, and has an absorptivity so high it requires a cell only a few microns thick to absorb sunlight. Unlike silicon cells, gallium arsenide (GaAs) cells are relatively insensitive to heat and are very resistant to radiation damage. Thus, gallium arsenide is particularly suitable for use in outer space applications.

The dual use effect can also be accomplished with amorphous or polycrystalline silicon. Because gallium arsenide and silicon material is an insulator, it has no electromagnetic effect on RF signals. Likewise, the "doped" material that is deposited on the gallium arsenide or silicon to form the current producing junctions is also virtually non-reactive with the electromagnetic spectra.

The combination photovoltaic cell and RF antenna units 10 may be assembled into arrays of cells connected together in series, or in parallel, or in a series-parallel combination to meet various output voltage and current requirements.

While this invention has been described fully and completely with special emphasis upon preferred embodiments it should be understood that, within the scope of the appended claims, the invention may be practiced otherwise than as specifically described herein.

What is claimed is:

1. A combination dual function photovoltaic cell and RF antenna for transmitting and receiving RF signals to and from a transceiver and converting light waves to electric power to operate the transceiver, comprising:
    a photovoltaic cell formed of semiconductor material laminated to a thin dielectric backing and electrically connected with the power circuit of a transceiver to supply electrical power thereto;
    said dielectric backing bonded to a metallic substrate to provide a ground plane;
    a shielded cable having a signal conductor interconnected at one end with said photovoltaic cell and a conductive shield interconnected at one end with said ground plane;
    said signal conductor having a second end adapted to be interconnected with a RF output stage of the transceiver and said conductive shield having a second end adapted to be interconnected with a ground stage of the transceiver; and
    said shielded cable tuned to provide impedance for optimum energy transfer between the transceiver and said photovoltaic cell; wherein
        said photovoltaic cell functions both as a patch antenna to transmit and receive RF signals to and from the transceiver and as a solar cell to convert light waves to electric power sufficient to operate the transceiver and during dual use both functions operate simultaneously without interference or degradation.

2. The dual function photovoltaic cell and RF antenna according to claim 1, wherein
    said semiconductor material is selected from the group consisting of gallium arsenide, indium gallium arsenide, amorphous silicon, and polycrystalline silicon.

3. A combined RF transceiver, photovoltaic cell and RF antenna, comprising:
    an RF transceiver powered by DC power for transmitting and receiving RF signals and comprising an electrical power circuit including an RF output stage and a ground stage;
    a photovoltaic cell formed of semiconductor material laminated to a thin dielectric backing and electrically connected with the power circuit of said transceiver to supply electrical power thereto;
    said dielectric backing bonded to a metallic substrate to provide a ground plane;
    a shielded cable having a signal conductor interconnected between said photovoltaic cell and the RF output stage of said transceiver;
    said shielded cable having a conductive shield interconnected between said metallic substrate ground plane and the ground stage of the transceiver;
    said shielded cable tuned to provide impedance for optimum energy transfer between the transceiver and said photovoltaic cell; whereby
        said photovoltaic cell functions both as a patch antenna to transmit and receive RF signals to and from the transceiver and also as a solar cell to convert light waves to electric power sufficient to operate the transceiver and during dual use both functions operate simultaneously without interference or degradation.

4. The combined RF transceiver, photovoltaic cell and RF antenna according to claim 3, wherein
    said semiconductor material is selected from the group consisting of gallium arsenide, indium gallium arsenide, amorphous silicon, and polycrystalline silicon.

5. The combined RF transceiver, photovoltaic cell and RF antenna according to claim 3, wherein
    said photovoltaic cell and said RF transceiver are joined together to form a unitary assembly.

6. The combined RF transceiver, photovoltaic cell and RF antenna according to claim 3, wherein
    said RF transceiver is a device selected from the group consisting of pressure sensors, temperature sensors, vibration sensors, acceleration sensors, fluid sensors, computing devices, telecommunication devices and electromechanical devices.

7. A method of interconnecting a photovoltaic cell to an RF transceiver to function as an RF antenna for transmitting and receiving RF signals to and from the transceiver and converting light waves to electric power to operate the transceiver, said method comprising the acts of:
    providing a photovoltaic cell formed of semiconductor material laminated to a thin dielectric backing;
    bonding said dielectric backing to a metallic substrate to provide a ground plane;
    electrically interconnecting said photovoltaic cell with a power circuit of the transceiver to supply electrical power thereto;
    interconnecting a signal conductor of a shielded cable between said photovoltaic cell and a RF output stage of the transceiver;
    interconnecting a conductive shield of said shielded cable between said metallic substrate ground plane and a ground stage of the transceiver;
    tuning said shielded cable to provide impedance for optimum energy transfer between the transceiver and said photovoltaic cell; whereby
        said photovoltaic cell functions both as a patch antenna to transmit and receive RF signals to and from the transceiver and as a solar cell to convert light waves to electric power sufficient to operate the transceiver and during dual use both functions operate simultaneously without interference or degradation.

8. The method according to claim 7, further comprising joining said photovoltaic cell and said RF transceiver together to form a unitary assembly.

9. The method according to claim 7, further comprising electrically interconnecting a plurality of said photovoltaic cells in an array to form an integral RF antenna and solar collector panel for transmitting and receiving RF signals and producing selected output voltage and current characteristics.

10. The method according to claim 9, further comprising mounting said integral RF antenna and solar collector panel on a spacecraft;

positioning said panel to receive photonic solar energy; and receiving photonic solar energy on said panel wherein said received solar photonic energy activates said photovoltaic cells to supply electrical energy, and said photovoltaic cells are capable of receiving and transmitting electromagnetic signals during said step of receiving photonic solar energy.

* * * * *